(12) United States Patent
Park et al.

(10) Patent No.: US 7,148,701 B2
(45) Date of Patent: Dec. 12, 2006

(54) APPARATUS FOR MEASURING ELECTRICAL IMPEDANCE

(75) Inventors: Sin-Chong Park, Daejeon (KR); In-Duk Hwang, Daejeon (KR)

(73) Assignees: Information and Communication University In-Duk Hwang, Daejeon (KR); Research and Industrial Cooperation Group, Daejeon (KR)

( * ) Notice: Subject to any disclaimer, the term of this patent is extended or adjusted under 35 U.S.C. 154(b) by 0 days.

(21) Appl. No.: 10/885,990

(22) Filed: Jul. 7, 2004

(65) Prior Publication Data

US 2005/0151545 A1    Jul. 14, 2005

(30) Foreign Application Priority Data

Jan. 8, 2004    (KR) .................... 10-2004-0001159

(51) Int. Cl.
*G01R 27/04* (2006.01)
*A61B 5/05* (2006.01)

(52) U.S. Cl. .................. 324/629; 324/649; 324/123 C; 600/547

(58) Field of Classification Search ................ 324/679, 324/76.79, 547, 123 C, 649, 629; 600/547
See application file for complete search history.

(56) References Cited

U.S. PATENT DOCUMENTS

| | | | | |
|---|---|---|---|---|
| 5,544,662 A * | 8/1996 | Saulnier et al. | ............. | 600/547 |
| 6,208,888 B1 * | 3/2001 | Yonce | ......................... | 600/509 |
| 6,232,834 B1 * | 5/2001 | Zheng | ......................... | 330/107 |
| 6,265,978 B1 * | 7/2001 | Atlas | .......................... | 340/575 |
| 6,292,690 B1 * | 9/2001 | Petrucelli et al. | ............ | 600/547 |
| 6,373,264 B1 * | 4/2002 | Matsumoto et al. | ......... | 324/667 |
| 6,631,292 B1 * | 10/2003 | Liedtke | ....................... | 600/547 |
| 6,720,828 B1 * | 4/2004 | Nelson et al. | ............... | 330/144 |
| 6,804,992 B1 * | 10/2004 | Goodman et al. | ........ | 73/40.5 A |
| 6,885,752 B1 * | 4/2005 | Chabries et al. | ............. | 381/321 |
| 6,925,325 B1 * | 8/2005 | Yonce | ......................... | 600/509 |
| 2004/0002662 A1* | 1/2004 | Hjelt et al. | .................. | 600/547 |
| 2005/0113712 A1* | 5/2005 | Petrucelli | ..................... | 600/547 |

OTHER PUBLICATIONS

ITC-CSCC 2003 Final Program (The 2003 International Technical Conference on Circuits/Systems, Computers and Communications, Jul. 7-9, 2003, Phoenix Park, Kang-Wong Do, Korea.
ITC-CSCC 2003 Proceedings (The 2003 International Technical Conference on Circuits/Systems, Computers and Communications, Jul. 7-9, 2003, Phoenix Park, Kang-Won Do, Korea.
IEEK Summer Conference 2003, Jul. 9-10, 2003, Phoenix Park, Kang-Won Do, Korea.
IEEK Summer Conference 2003 Proceedings, Jul. 9-10, 2003, Phoenix Park, Kang-Woo Do, Korea.

* cited by examiner

*Primary Examiner*—Anjan Deb
*Assistant Examiner*—Marina Kramskaya
(74) *Attorney, Agent, or Firm*—Alston & Bird LLP

(57) ABSTRACT

The present invention provides an apparatus for measuring electrical impedance comprising: two input electrodes contacted to a subject for measuring impedance; a difference amplifier to which two signals inputted to the two input electrodes are inputted; a device for extracting a common mode component of two signals inputted to the two input electrodes; the third electrode contacted to the subject for measuring impedance; the first multiplier to which the common mode component is inputted; the first filter coupled with the first multiplier; the second multiplier coupled with the first filter; wherein a feedback signal outputted from the second multiplier is inputted to the third electrode.

8 Claims, 2 Drawing Sheets

APPARATUS FOR MEASURING ELECTRICAL IMPEDANCE

CROSS REFERENCE TO RELATED APPLICATION

This application claims priority to and the benefit of Korea Patent Application No. 10-2004-0001159 filed on Jan. 8, 2004 in the Korean Intellectual Property Office, the entire content of which is incorporated herein by reference.

BACKGROUND OF THE INVENTION (a) Field of the Invention

The present invention relates to an apparatus for measuring electrical impedance correctly. More specifically, the present invention relates to an apparatus for measuring electrical impedance applicable for a reliable analysis of body fat. However, the apparatus according to the present invention can be applied to other fields apart from analysis of body fat.

The apparatus for measuring electrical impedance includes a device applying electrical current to a subject and a difference amplifier measuring difference voltage induced to the subject. The apparatus for measuring electrical impedance can be applied in various fields. For example, body fat analysis can be done conveniently by measuring electrical impedance with a relatively simpler apparatus than that for other measurements.

(b) Description of the Related Art

In many measures of electrical impedance such as can be used in body fat analysis, electrical impedance is measured by using 4-electrode method. To measure body impedance by 4-electrode method AC is applied to body through a pair of electrodes contacted to body, and a difference amplifier measures voltage difference between another pair of electrodes contacted to other parts of the body. The reason for using the 4-electrode method is to reduce the effects of the contact impedance between the electrodes and human skin. For analysis of segmental body fat, at least two pairs of electrodes are used to measure each segment, and a multiplexer can change the measuring pairs of electrodes. However, various errors can occur at high frequency in an apparatus for measuring electrical impedance. Particularly, it is not easy to measure body impedance correctly at high frequency.

One of the representative errors occurring in measurement of the electrical impedance is due to a common mode voltage inputted to a difference amplifier. A common mode voltage means an average value of two voltages inputted to a difference amplifier.

Another error is due to a limited input impedance of a preamplifier. The preamplifier is an amplifier located as close as possible to an electrode for measuring voltage, and is referred as an input buffer or front end. To extract more useful information from electrical impedance measure, it is necessary to measure impedance in a wide range from low frequency to high frequency. However, the two errors increase as frequency rises.

In analyzing electrical impedance for body, since electrode impedance is very large, a common mode voltage inputted to a difference amplifier is increased remarkably. In case that common mode voltage is high, a voltage outputted from a difference amplifier is incorrect. Thus, it is necessary to reduce a common mode voltage inputted to a difference amplifier for accurate measurement of electrical impedance, and a common mode feedback is used for the reduction of the common mode voltage (Rosell, J., and Riu, P.: 'Common-mode feedback in electrical impedance tomography', Clin. Phys. Physiol. Meas., V. 13(Suppl. A.), pp. 11–14, 1992). However, a conventional common mode feedback method has a problem of oscillation at a high frequency. Therefore, it is difficult to apply a common mode feedback method at a high frequency over tens of kHz.

An input impedance of a preamplifier at high frequency is determined by an input capacitance present at input terminal of the preamplifier. The preamplifier is commonly constructed by using an operational amplifier, and input capacitance can be several pF. The impedance at 1 MHz corresponding to the capacitance of such magnitude is several tens of kΩ. Thus, a loading error occurs, since input impedance of the preamplifier is not high enough compared to that of an electrode. Thus, for the accurate measurement of electrical impedance, it is necessary to have input impedance increased by reducing input capacitance of the preamplifier.

In a negative capacitance circuit (FIG. 3) known as a conventional method for reducing input capacitance, a positive feedback of signal outputted from a preamplifier is applied to input terminal of the preamplifier through a capacitor. (Rigaud, B., Record, P. M., Anah, J., and Morrucci, J. P.: 'Active electrodes for electrical impedance tomography: The limitation of active stray capacitance compensation', Annual Int. Conf. of the IEEE Eng. in Med. and Biol. Soc., V. 13, pp. 1587–1588, 1991.)

In the conventional method a negative capacitance obtained from the positive feedback cancels out the input capacitance of the preamplifier, and input capacitance of the preamplifier becomes zero.

However, as a frequency gets high, a loop gain becomes high, which causes a risk of oscillation. Further, a loop gain depends on impedances of electrodes. Therefore, an operational amplifier of narrow bandwidth should be used to suppress oscillation in the conventional method, making it difficult to select an operational amplifier with adequate bandwidth considering impedance of electrode.

Further, it is difficult to change a gain margin when impedance of electrode is changed. And if a preamplifier has gain peaking generated at a frequency of maximum loop gain, the gain margin corresponding to gain peaking vanishes, which results in easy oscillation.

In sum, an apparatus for measuring electrical impedance causes an error by a common mode voltage and another error by an insufficient impedance of a preamplifier. This calls for an apparatus which can reduce the errors by a common mode voltage and by an insufficient impedance of a preamplifier.

SUMMARY OF THE INVENTION

The contribution of the present invention is to provide an apparatus for measuring electrical impedance for reducing errors caused by a common mode voltage and by an insufficient impedance of a preamplifier, thus measuring electrical impedance correctly.

In one aspect of the present invention, there is provided an apparatus for measuring electrical impedance comprising: two input electrodes contacted to a subject for measuring impedance; a difference amplifier to which two signals inputted to the two input electrodes are inputted; a device for extracting a common mode component of two signals inputted to the two input electrodes; the third electrode contacted to the subject for measuring impedance; and the first multiplier to which the common mode component is inputted; the first filter coupled with the first multiplier; the second multiplier coupled with the first filter; wherein a feedback signal outputted from the second multiplier is inputted to the third electrode.

In another aspect of the present invention, there is provided an apparatus for measuring electrical impedance comprising a preamplifier comprising: a voltage follower; a wideband variable-gain gain stage coupled with the voltage follower; and a feedback capacitor and a feedback resistor connected in series between an input terminal of the voltage follower and an output terminal of the gain stage; wherein input impedance of the preamplifier is high.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

Figure 1:
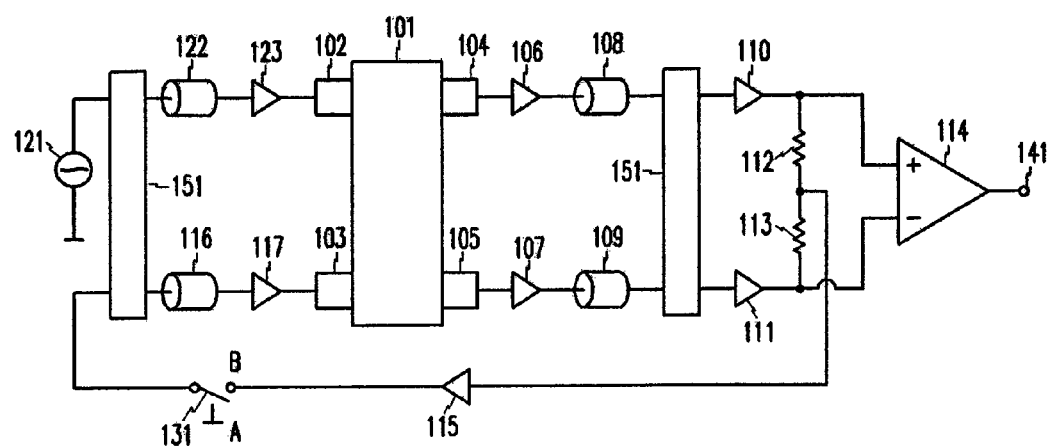
FIG. 1 shows an apparatus for measuring electrical impedance according to the present invention.

Hereinafter, preferred exemplary embodiment is explained referring to the drawings in detail.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

FIG. 1 shows an apparatus for measuring electrical impedance according to the exemplary embodiment of the present invention. In FIG. 1, when a switch is connected to A, a very high common mode voltage occurs since a common mode feedback is not performed. In case the switch is connected to B, the common mode feedback signal of the present invention is applied. In FIG. 1, for convenience, a voltage source 121 is applied instead of a current source usually used in the conventional method, in order to apply the current to a subject. But, the current source can be used instead of the voltage source 121.

Further, the apparatus for measuring electrical impedance of FIG. 1 has a distributed circuit configuration for measuring with high frequencies. Contrary to a conventional centralized configuration, in the distributed circuit configuration, drivers 123 and 117 and preamplifiers 106 and 107 for measuring voltages are located close to electrodes 102, 103, 104 and 105 and are connected to the main part of the apparatus through coaxial cables 108, 109, 116 and 122. Thus, the voltage of the voltage source 121 is applied to subject 101 through the coaxial cable 122, the driver 123, and the electrode 102. Measuring the voltage is performed by a difference amplifier 114 through the preamplifiers 106 and 107 established close to the electrodes 104 and 105, the coaxial cables 108 and 109, and the voltage followers 110 and 111.

In case a common mode feedback is applied, a common mode voltage is sampled by two matched resistors 112 and 113, is amplified by a feedback amplifier 115, and is fed back to the electrode 103 through a coaxial cable 116 and a driver 117. Even though FIG. 1 shows a distributed circuit configuration, the present invention is also applicable to a centralized configuration.

A conventional feedback amplifier 115 is designed to have a dominant pole for the stability of the feedback loop, however, a phase delay of 90 degrees occurs at a high frequency and the phase margin reduces, due to the dominant pole. Thus, the bandwidth and the gain of the conventional feedback amplifier should be limited or the feedback loop becomes unstable.

Figure 2:
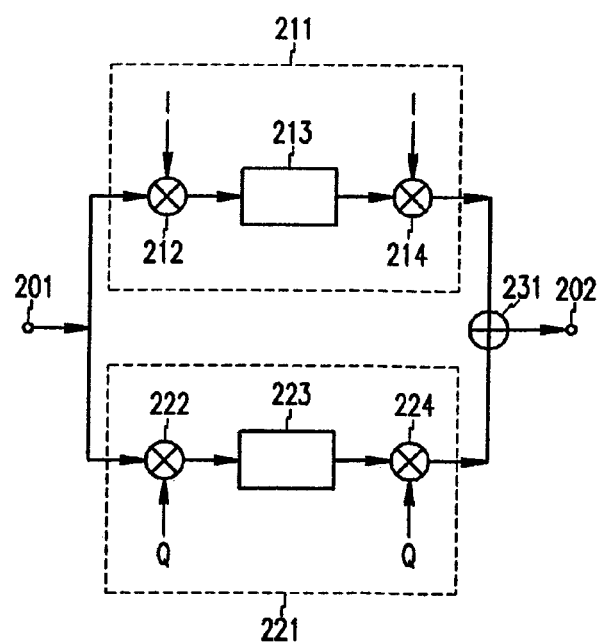
FIG. 2 shows a feedback amplifier according to the present invention.

To solve the problems of the conventional feedback amplifier, the present invention provides a feedback amplifier 115 used in the apparatus for measuring electrical impedance, the configuration of which is shown in FIG. 2. A feedback amplifier 115 comprises an in-phase amplifier 211 using I(In-phase) signals and a quadrature amplifier 221 using Q(Quadrature) signals of the same configuration. A common mode voltage inputted to the in-phase amplifier 211 is multiplied at the first multiplier 212 by the I signal which has the same phase as that of a voltage source 121, and a common mode voltage inputted to the quadrature amplifier 221 is multiplied at the third multiplier 222 by the Q signal orthogonal to the signal of the voltage source 121.

In case the first filter 213 and the second filter 223 are low pass filters, the first filter 213 and the second filter 223 output an amplitude of an in-phase component of the common mode voltage, and an amplitude of a quadrature component through performing a phase-sensitive detection respectively. The detected signals outputted from the first filter 213 and the second filter 223 respectively are used at the second multiplier 214 and the forth multiplier 224 to modulate the amplitudes of the I signal and the Q signal. The amplitude modulated I and Q signals are combined by a non-inverting adder 231 to become an output signal of the feedback amplifier 115.

As a result, the feedback amplifier 115 amplifies the signal having the same frequency as that of the I signals and that of the Q signals, i.e., that of the common mode voltage, and does not amplify noise of a frequency different from that of the common mode voltage. Therefore, the oscillation at an undesired frequency is suppressed. Further, contrary to the conventional feedback amplifier, the feedback amplifier 115 needs no dominant pole, thus having an advantage that loop gain can be increased safely at a high frequency.

In the exemplary embodiments, the frequency of I signals and that of Q signals shown in FIG. 2 always correspond to each other. The first filter 213 and the second filter 223 are low pas filters, and outputs from the first filter 213 and the second filter 223 are DC voltages, when the frequency of the voltage source 121 corresponds to that of the I signal in the steady state. In this instance, the second multiplier 214 and the fourth multiplier 224 function as variable gain amplifiers. Thus, the second multiplier and the fourth multiplier can be respectively replaced with a variable gain amplifier in the apparatus for measuring electrical impedance.

Meanwhile, in case the frequency of the common mode voltage is different from that of the I signals, band pass filters can be employed as the first filter 213 and the second filter 223. In this case, in the steady state, outputs from the first filter 213 and the second filter 223 become AC voltages of which frequency is a difference between the frequency of the common mode voltage and that of I signals. When the band pass filters are used for the first filter 213 and the second filter 223, the third filter and the fourth filter are added to the output terminals of the second multiplier 214 and the fourth multiplier 224 so as to obtain a feedback signal with the same frequency as that of the common mode voltage.

The reason for the feedback amplifier 115 to use the in-phase amplifier 211 and the quadrature amplifier 221 with the same configuration is that the phase of the common mode signal shifts from the phase of the voltage source 121 or that of the I signals when the electrodes 102 and 103 and the subject 101 respectively have reactive components in addition to resistive components. When the reactive components of the electrodes 102 and 103 and the subject 101 are much less than the resistive components, only the in-phase amplifier 211 can be used. Alternatively, only the quadrature amplifier 221 can be used. In the feedback amplifier 115, the I signals and the Q signals can be generated from the signal of the voltage source 121 by using the conventional method. Though it is not necessary that the I signals are orthogonal to the Q signals, it is not difficult to make the I signals and the Q signals be orthogonal to each other.

In FIG. 1, two resistors 112 and 113 of the same value are used to extract the common mode voltage, but other methods can be used.

The apparatus for measuring electrical impedance according to the present invention can be easily applied to measuring body fat. More electrodes, drivers and preamplifiers which are not shown in FIG. 1 for convenience, can be added for measuring segmental body fat. In this case, a multiplexer 151 should be added for changing connections of the electrode pairs. An apparatus for measuring electrical impedance including a feedback amplifier according to the present invention can be easily embodied with commercial components.

Figure 3:
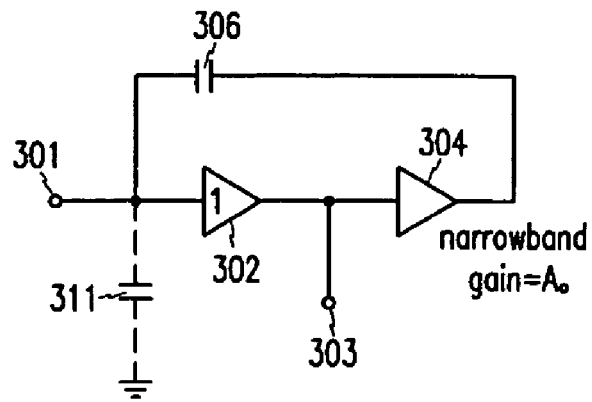
FIG. 3 shows a preamplifier according to the conventional method.
Figure 4:
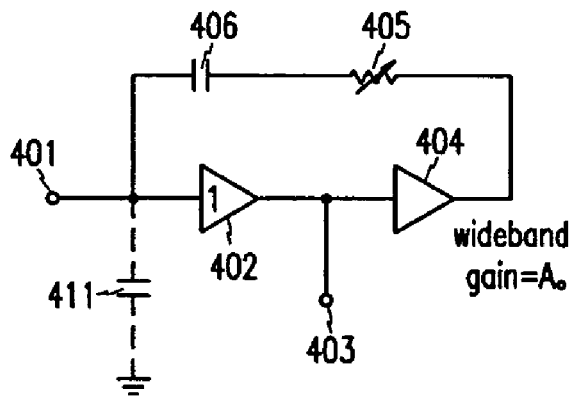
FIG. 4 shows a preamplifier according to the present invention.

FIG. 3 shows a conventional preamplifier, and FIG. 4 shows a preamplifier according to the preferred embodiment of the present invention. The conventional preamplifier includes a voltage follower 302 and a gain stage 304. The voltage follower 302 transfers signals inputted to an input terminal 301 to an output terminal 303, without changes. In the conventional method, a feedback capacitor 306 is inserted between the output terminal of the gain stage 304 and the input terminal of the voltage follower 302 so as to reduce an input capacitance 311 of the voltage follower 302. When a gain $A_0$ of the gain stage is controlled to be greater than 1, the input capacitance of the input terminal 301 can become zero. However, since the circuit has a danger of oscillation, the bandwidth of the gain stage should be narrow so as to prevent oscillation, thereby having the above-noted problems.

In comparison with the conventional circuit, according to the preferred embodiment, the preamplifiers 106 and 107 shown in FIG. 1 include a broadband gain stage 404 as shown in FIG. 4, and further include a feedback resistor 405 in addition to the feedback capacitor 406. Whereas the narrowband gain stage 304 suppresses the oscillation in the conventional method, the feedback resistor 405 suppresses the oscillation in the preferred embodiment.

The preamplifier of the present invention uses a broadband voltage follower 402 to obtain an output with gain of 1, with respect to the input signal. The voltage follower 402 does not exert any effects to the positive feedback. The broadband voltage follower 402 and the broadband gain stage 404 can be easily embodied using the conventional method. For the embodiment of the broadband voltage follower 402 and the broadband gain stage 404, high speed operational amplifiers such as AD8055 of Analog Devices Inc. can be used, of which the gain bandwidth product is 300 MHz.

However, a high speed transistor is applicable other than the high speed operational amplifier, and a combination of a high speed transistor and a high speed operational amplifier is also available. In addition, a variable resistor can be used to control the gain of the broadband gain stage 404 to be greater than 1. Further, the resistance of the feedback resistor 405 is varied to control the loop gain of the positive feedback.

In the detailed description, only the preferred embodiment of the invention has been shown and described, simply by way of illustration of the best mode contemplated by the inventors of carrying out the invention. As will be realized, the invention is capable of modification in various obvious respects, all without departing from the invention. Accordingly, the drawings and description are to be regarded as illustrative in nature, and not restrictive.

The present invention provides an apparatus for measuring electrical impedance which can reduce the error caused by a common mode voltage and the error caused by an insufficient impedance of the preamplifier. A circuit simulation and a circuit embodied in practice proved that the present invention solves the problem of the conventional method, and shows the effect of the present invention.

The feedback amplifier 115 according to the present invention amplifies only the input signal, and the phase delay between the input signal and the output signal is 180 degrees. Thus, a desirable effect of a negative feedback is obtained and the apparatus for measuring electrical impedance operates stably.

The common mode voltage of the two signals inputted to a difference amplifier 114 is decreased by the amount of the loop gain. Thus, the error of the difference voltage measured from the difference amplifier 114 is reduced. In general, the common mode rejection ratio of the difference amplifier becomes smaller at high frequency. However, according to the present invention, the common mode voltage can be reduced even at high frequency, and thus the error by the common mode voltage can be reduced at high frequency. Particularly, even when the loop gain is high, a feedback loop operates stably. Thus, the common mode voltage can be reduced to zero with a high loop gain, which has been experimentally verified.

In addition, when the electrical current is applied by means of step function for measuring electrical impedance, the common mode voltage is reduced much faster than the time constant of the low pass filters, since the response speed of the common mode feedback loop is increased according to the loop gain. Further, though the feedback amplifier 115 according to the present invention includes a plurality of multipliers, harmonics of the measuring frequency included in the output of the feedback amplifier 115 are very low. Thus, the apparatus for measuring the electrical impedance according to the present invention allows accurate and fast measurement of impedance at the broadband frequency range for measuring body fat.

The conventional negative capacitance circuit has inconvenience of selecting an operational amplifier having adequate bandwidth for restricting loop gains and a difficulty in tuning a gain margin of the positive feedback when the electrode impedance is changed. Further, when gain peaking occurs, the gain margin vanishes and thus oscillation occurs easily.

According to the present invention, since a broadband operational amplifier can be used to embody the gain stage 404 of the preamplifiers 106 and 107, it is easy to select an operational amplifier and to tune the gain margin with the feedback resistor 405. Even if the gain stage 404 has gain peaking, gain peaking occurs at a higher frequency than the frequency of the maximum loop gain, and thus the gain margin is rarely changed. Thus, the preamplifiers 106 and 107 according to the present invention can be operated stably even with a very low gain margin. In addition, when the gain of the gain stage 404 is 6 dB, the input impedance of the preamplifiers 106 and 107 according to the present invention is greater than that of the preamplifier according to the conventional method by 6 dB at all frequency ranges. Thus, the gain stage of the preamplifiers 106 and 107 according to the present invention is usefully applied to accurately measuring electrical impedance.

The present invention can be modified and used in various applications apart from the exemplary embodiment explained above. For example, an electrical impedance device according to the present invention can be applied to an electrical impedance tomography or a diagnosis of breast cancer.

What is claimed is:

1. An apparatus for measuring electrical impedance, comprising:
    two input electrodes contacted to a subject for measuring impedance;
    a difference amplifier to which two signals inputted to the two input electrodes are inputted;
    a device for extracting a common mode component of the two signals inputted to the two input electrodes;
    the third electrode contacted to the subject for measuring impedance;
    the first multiplier to which the common mode component is inputted;
    the first filter coupled with the first multiplier; and
    the second multiplier coupled with the first filter such that the first and second multipliers and the first filter are in series;
    wherein a feedback signal outputted from the second multiplier is inputted to the third electrode.

2. The apparatus for measuring electrical impedance of claim 1, wherein the second multiplier is a variable gain amplifier.

3. The apparatus for measuring electrical impedance of claim 1, wherein the first filter is a low pass filter.

4. The apparatus for measuring electrical impedance of claim 1, wherein a filter is added between the output terminal of the second multiplier and the third electrode.

5. The apparatus for measuring electrical impedance of claim 1, wherein the apparatus further comprises:
    the third multiplier to which the common mode component is inputted;
    the second filter coupled with the third multiplier;
    the fourth multiplier coupled with the second filter; and
    a device for combining a signal outputted from the fourth multiplier and a signal outputted from the second multiplier;
    wherein a feedback signal outputted from the device for combining signals is inputted to the third electrode.

6. The apparatus for measuring electrical impedance of claim 5, wherein a phase difference between an I signal inputted to the second multiplier and that of a Q signal inputted to the fourth multiplier is 90 degrees.

7. The apparatus for measuring electrical impedance of claim 1, wherein the apparatus comprises a plurality of electrode pairs, and a multiplexer for changing the electrode pairs.

8. The apparatus for measuring electrical impedance of claim 7, wherein the apparatus is applied to measuring body fat.

* * * * *